Nov. 24, 1970 D. M. BROWN 3,541,676
METHOD OF FORMING FIELD-EFFECT TRANSISTORS UTILIZING
DOPED INSULATORS AS ACTIVATOR SOURCE
Filed Dec. 18, 1967 2 Sheets-Sheet 1

Inventor:
Dale M. Brown,
by John F. Ahern
His Attorney.

Nov. 24, 1970 D. M. BROWN 3,541,676
METHOD OF FORMING FIELD-EFFECT TRANSISTORS UTILIZING
DOPED INSULATORS AS ACTIVATOR SOURCE
Filed Dec. 18, 1967
2 Sheets-Sheet 2

Inventor:
Dale M. Brown,
by John F. Ahern
His Attorney.

United States Patent Office 3,541,676

Patented Nov. 24, 1970

3,541,676

METHOD OF FORMING FIELD-EFFECT TRANSISTORS UTILIZING DOPED INSULATORS AS ACTIVATOR SOURCE

Dale M. Brown, Schenectady, N.Y., assignor to General Electric Company, a corporation of New York Filed Dec. 18, 1967, Ser. No. 691,483
Int. Cl. B01j *17/00;* H01g *13/00;* H01j *11/14*
U.S. Cl. 29—571 8 Claims

ABSTRACT OF THE DISCLOSURE

Self-registered field-effect transistors are made by forming gate insulator with a thick film of doped insulator thereover. The doped insulator is etched at one region to define the gate area and separate the source from the drain region. Source and drain regions are formed by diffusing activator from the remaining portions of the doped insulating film. Apertures are etched in the insulating films to expose source and drain, and source, drain, and gate electrodes are formed in contact with respective regions of the device.

THE DISCLOSURE

Figure 1:
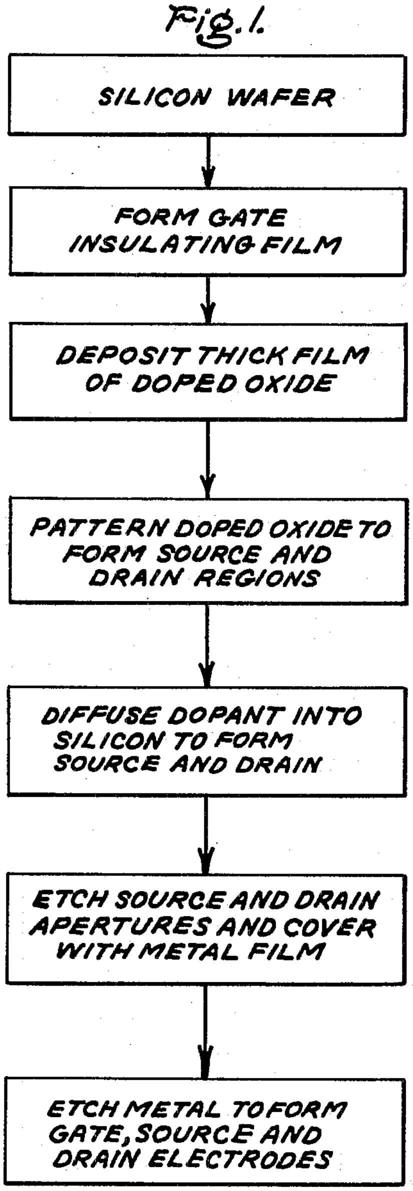

The present invention relates to field-effect transistors wherein source and drain regions are formed within surface-adjacent portions of a semiconductor body, the a gate electrode to modulate conduction therebetween. surface between these two regions being in registry with More particularly, the present invention relates to such devices wherein self registry of the gate electrode with the surface-adjacent channel between the source and drain is obtained automatically without difficult, expensive, and time-consuming operations.

In the technology of field-effect transistors, one of the most difficult objectives to be obtained is perfect registry of the source and drain PN junctions with the gate electrode. More particularly, the channel between the source and drain region must be completely covered by the gate electrode member, and the source and drain regions should, therefore, overlap the area covered by the gate. Although some overlap between source and drain should occur, this overlap should be kept to a minimum in order to optimize device parameters.

In prior art methods of fabrication of field-effect transistors, registry between the source and drain junctions, on one hand, and the gate electrode, on the other hand, was generally obtained by a plurality of masking steps, whereby the source and drain regions are formed by one operation involving a first masking, and the gate electrode region is formed by a second masking operation. This method of formation requires the extremely difficult and time-consuming task of insuring that the first and second masking operations are such that the apertures defined by each are in registry with one another. This is particularly difficult when it is considered that the extent of a field-effect transistor as fabricated in integrated circuit technique may only be a matter of a few thousandths of an inch in total lateral cross section.

In accord with the invention set forth and described in the copending application of Brown, Engeler, Garfinkel, and Gray, entitled Self-Registered IG-FET Devices and Method of Making the Same, application Ser. No. 675,228, filed Oct. 12, 1967, and assigned to the present assignee, self-registered field-effect transistor devices are disclosed and are fabricated utilizing a portion of a patterned film of molybdenum as a gate electrode. The gate electrode is formed simultaneously with the steps of the formation of the channel-adjacent regions of the source and drain, thus, insuring automatic registry.

While this method and the devices produced thereby are great improvements upon the prior art, and devices in accord with that invention have automatic registry obtained with much less difficulty than by methods of the prior art, it is nevertheless more complicated than is desired for ultimate simplicity in large-scale manufacture.

Accordingly, one object of the present invention is to provide a method of forming field-effect transistors having automatic registry, which is extremely simple, inexpensive, and readily performed.

Still another object of the present invention is to provide improved field-effect transistors having automatic registry, comprising only the most elemental structural features.

Yet another object of the present invention is to provide methods for forming field-effect transistors wherein the insulator between the gate and the channel thereof is fully protected at all times and is not removed during fabrication.

Briefly stated in accord with the present invention, self-registered field-effect transistors are provided by processing a wafer of semiconductive material having a substantially planar major surface and forming thereupon a thin film gate insulator. A relatively-thick film of a doped insulator is deposited thereupon and is patterned to define a gate aperture which separates the remaining portions of the insulating film into separate regions corresponding to source and drain regions to be formed in the semiconductor body. The semiconductor body is heated to cause activators to be diffused into separate surface adjacent regions of the semiconductor wafer from the remaning portions of the doped insulating film upon the wafer to form source and drain regions. Apertures are provided within the remaining portions of the doped insulating film, and contact is made to the source and drain. A gate electrode is formed within the gate aperture and contact is made thereto.

The novel features believed characteristic of the present invention are set forth in the appended claims. The invention itself, together with further objects and advantages thereof, may best be understood by reference to the following detailed description taken in connection with the attached drawing in which, FIG. 1 is a flow chart illustrating successive steps in the formation of one embodiment of a field-effect transistor in accord with the present invention.

Figure 2:
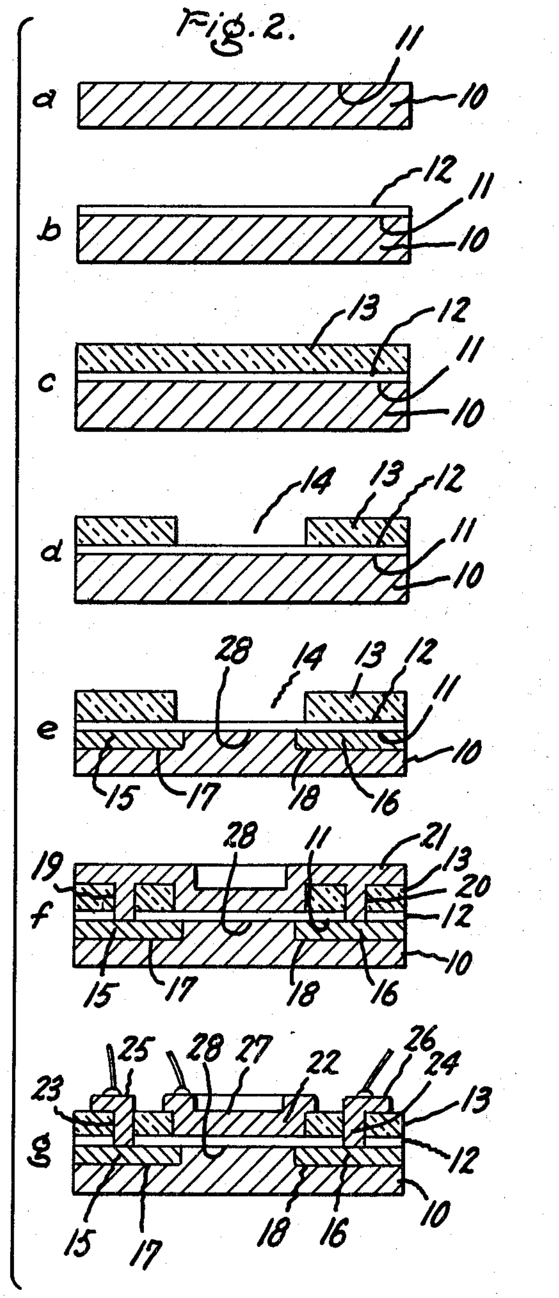
Figure 3:
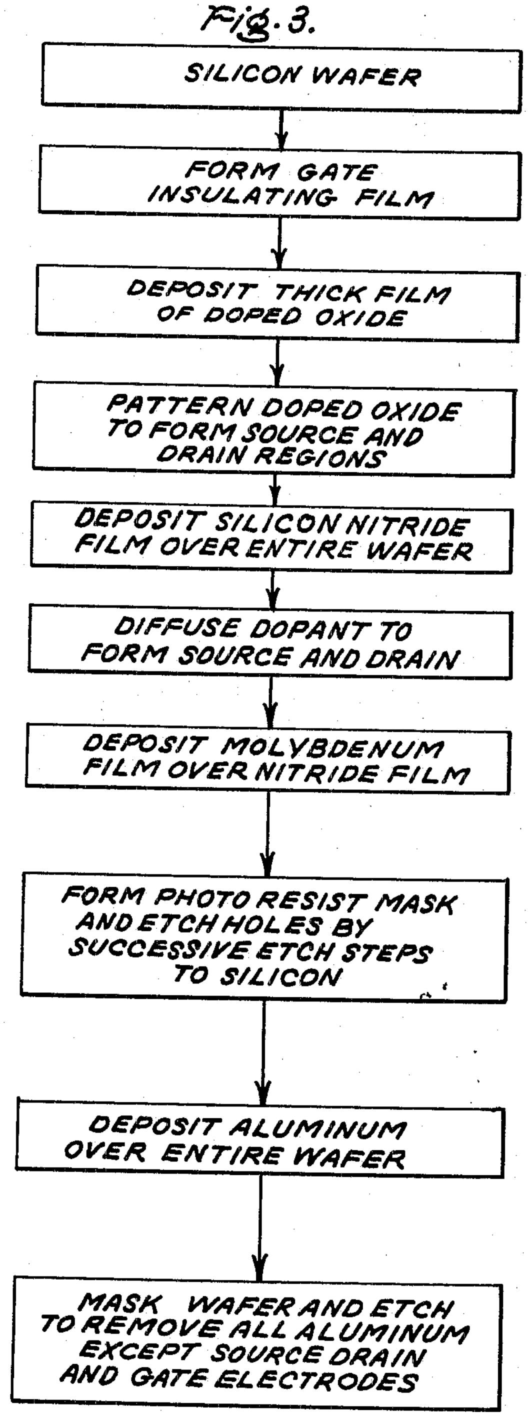
Figure 4:
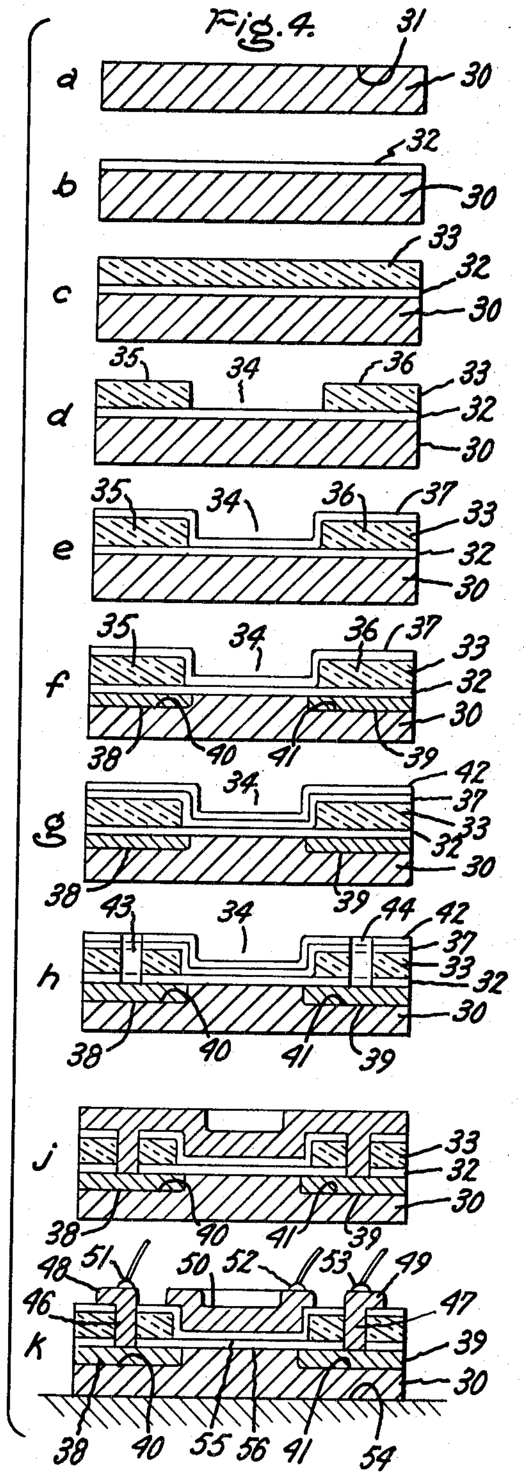

FIG. 2 is a series of schematic, vertical cross-sectional views of a semiconductor wafer in fabrication corresponding to successive steps in the flow diagram of FIG. 1, FIG. 3 is a flow diagram illustrating an alternative method for the formation of field-effect transistors in accord with the present invention, and FIG. 4 is a succession of schematic cross-sectional, vertical views of a semiconductor device in fabrication according to separate steps as illustrated in the flow diagram of FIG. 3.

In accord with the method of the present invention, field-effect transistors may be fabricated for such semi- of materials, well known to be suitable for such semiconductor devices. Thus, for example, such devices may be fabricated from germanium, silicon, and gallium arsenide. For ease and conciseness of description, the method in accord with the present invention will be described with respect to the formation of field-effect transistors utilizing a silicon semiconductor body as the substrate material.

In FIG. 1, and the accompanying illustrations in FIG. 2 corresponding to the process step of FIG. 1, a field-effect transistor, in accord with one embodiment of the present invention, may conveniently be formed by suitably treating, as for example, by lapping, etching, and washing, a silicon wafer having a desirable crystallographic orientation, as for example, an exposed plane having a (1,0,0) crystallographic orientation, with a substantially flat major surface, and having length and width dimensions large as compared with the thickness dimension thereof for the formation of a large number of identical devices which are later separated. The prepared silicon wafer is next coated with a suitable gate insulator. Numerous gate insulating materials are known to the art, as for example, silicon dioxide and silicon oxynitride, which is an amorphous composition containing silicon, oxygen, nitrogen and which may be formed by the pyrolysis from a gaseous mixture of a silane, oxygen and ammonia upon a heated silicon substrate. Each material utilized as a gate insulator has its advantages; however, in accord with the present invention, a necessary criterion is that the material must be one which is readily permeable to diffusion by activator atoms for inducing predetermined conductivity-type characteristics to the semiconductor body. Such activators are normally donors or acceptors. Typical donors for germanium and silicon are arsenic, antimony, and phosphorus; and suitable acceptors for germanium and silicon, are aluminum, gallium, and indium. For clarity of description and brevity, the invention will be described using silicon dioxide as the gate insulator. Silicon dioxide is ideal for use in this respect, in that high-purity silicon dioxide films may be thermally grown in oxygen upon the surface of a silicon semiconductor wafer, and since the original silicon is of high purity, generally only doped to a concentration of approximately $10^{15}$ atoms of activator per cubic centimeter, the silicon dioxide grown in an oxygen atmosphere is likewise of high purity, a good protector of the source and drain PN junctions and serves to passivate these junctions effectively. In further accord with the invention, the high-purity passivating gate oxide remains in place throughout processing to completely passivate and protect the junctions.

Conveniently, a film 12 of approximately 1000 AU thickness of thermally-grown, high-purity silicon dioxide is formed upon the substanitally-flat major surface 11 of a silicon semiconductor wafer 10, by heating the wafer in an atmosphere of dry oxygen at a temperature of 1000° C. to 1200°, and preferably at approximately 1100° C. for approximately one half to three hours, depending upon temperature and crystallographic orientation. Film 12 is highly uniform and of high purity and serves ideally as the gate insulator for a field-effect transistor.

Subsequent to the formation of the gate insulator film 12, a thick layer of the order of 3000 to 10,000 AU in thickness of a suitable activator-doped insulator is deposited over gate oxide 12. While the thick film 13 may be silicon oxynitride or other suitable compounds, it is preferably formed of silicon dioxide which may be deposited by pyrolysis from a suitable atmosphere. If the substrate 10 is N-type silicon, it is desirable that the thick film 13 be doped with an appropriate concentration such as, for example, 1 percent by weight of a suitable acceptor as, for example boron. If, on the other hand, the wafer 10 has P-type conduction characteristics, it is desirable that film 13 be doped with approximately 1 percent, for example, of an appropriate donor activator as, for example, phosphorus.

Assuming that the wafer is of P-type conductivity, being doped with a concentration of approximately $10^{15}$ atoms per cc. of boron, a suitable phosphorus-doped film approximately 5000 AU thick of silicon dioxide may be formed by heating the oxide-coated wafer in a deposition chamber to a temperature of approximately 800° C., while a flow of dry argon gas saturated with ethyl orthosilicate and triethyl phosphate, is passed thereover. This may be accomplished, for example, by bubbling dry argon through ethyl orthosilicate at a flow rate of approximately seven cubic feet per hour, and by bubbling dry argon through triethyl phosphate at a flow rate of approximately 0.7 cubic foot per hour, mixing the two flows and causing the argon to flow over the heated wafer at a rate of approximately 7.7 cubic feet per hour for approximately 5 minutes. This results in a 5000 AU thick film of phosphorus-doped silicon dioxide suitable for use in the practice of the invention.

In an alternative to the foregoing step, a composite film 13 having a particular utility may be formed by first depositing an undoped film of silicon dioxide of approximately 1000 AU thickness by the foregoing method, utilizing only the ethyl orthosilicate saturated argon as the flow for approximately 1 minute. Subsequently, a 4000 AU thick film of phosphorus-doped silicon dioxide may be formed by the process step as described above, carrying out the reaction for approximately 4 minutes, to secure the necessary thickness.

After the formation of doped oxide film 13, the oxide is covered with suitable, commercially available, photoresist and photolithographic techniques well known to the art as, for example, set forth in greater detail in the aforementioned application of Brown, Engeler, Garfinkel, and Gray, the disclosure of which is incorporated herein by reference thereto, to cause a central portion 14 of the wafer to be unprotected with a photoresist layer while two separate regions of the film 13 on either side of region 14 are protected. This may be accomplished by providing a mask to cover region 14 while the photoresist-covered wafer is exposed to suitable activating radiation to fix the exposed portions and subsequently immersing the wafer in a photoresist developer which dissolves away that portion of the wafer indicated at 14 FIG. 2*d*, leaving the remainder of film 13 which constitutes two separate and unconnected regions covered with the doped silicon film 13. It is to be understood that the representation in FIG. 2 is that a linear device without circular symmetry. Alternatively, the structure of the device could have circular symmetry, in which case region 14 would be an annular groove which separates a central portion from a peripheral portion on the outer edge thereof. The simplest possible configuration is, however, as illustrated in FIG. 2.

After the photoresist film is formed in a pattern exposing region 14 of film 13, the wafer is immersed in a suitable etchant for the insulator, as for example, Buffered HF (one part concentrated HF to ten parts of a 40 percent solution of $NH_4F$), in the case of silicon dioxide. Etching is carried out carefully, under close observation, to insure removal of all of the doped silicon dioxide, but without substantially affecting the passivating gate oxide film 12. This may be accomplished by timing the etching, since the etch rate is readily known (1000 AU per minute for $SiO_2$ in Buffered HF, for example). Additionally, in the case of doped silicon dioxide, the color of the oxide visible beneath region 14 is a ready guide. Thus, phosphorus-doped $SiO_2$ is blue-green, while pure $SiO_2$ is a deep cobalt blue. Once the color of the wafer in region 14 changes to the deep blue, the etching may be stopped.

In this latter respect the use of a composite film 13 of 1000 AU of undoped $SiO_2$ and 4000 AU of phosphorus-doped $SiO_2$ is of great advantage. Thus, the etch cycle may proceed until the color changes to deep blue, indicating that the 1000 AU undoped glass portion of film 13 has been reached. The etch may then be continued for another 15 or 20 seconds to insure the removal of all doped $SiO_2$, without reaching the pure thermally-grown, passivating film 12 which is, ideally, not etched at all.

After etching, the photoresist pattern is removed by washing in trichloroethylene.

After the formation and patterning of film 13, the wafer is placed in a diffusion chamber and is heated to a temperature from 1000° C. to 1200° C. to cause the diffusion of the phosphorus-donor activators within film 13, through insulating film 12, and into the regions of wafer 10 adjacent major surface 11 to cause regions 15 and 16 to be converted into N-type conductivity semiconductor and thereby form source and drain regions, respectively. N-type source and drain regions 15 and 16 define, with the remaining P-type portion of wafer 10, source and drain PN-junctions 17 and 18, respectively. It should be noted that, along with the vertical diffusion through surface 11 and away therefrom, that latteral diffusion also occurs to cause the intersection of junctions 17 and 18 with surface 11 to extend under the region of film 12 over which aperture 14 exists.

If the 5000 AU, for example, doped silicon dioxide film 13 is all doped with phosphorus, the diffusion step may be carried out for approximately one hour to cause a penetration of approximately 2.5 microns beneath surface 11 of wafer 10. If, on the other hand, the variation of a 1000 AU thick initially deposited, undoped silicon dioxide region of film 13 has been utilized, a diffusion time of approximately 4 hours may be necessary to cause the formation of a 2.5 micron deep penetration into wafer 10.

After the formation of source and drain regions 15 and 16, respectively, it is necessary to form contacts to source and drain regions and to form a gate electrode which overlaps the intersection of source and drain PN junctions 17 and 18, respectively. This may conveniently be accomplished by forming source and drain apertures 19 and 20 in film 13 of such substantial area as to appropriately contact a sufficient region of the source and drain regions, respectively. Thus, if the source and drain are relatively deep, looking into the plane of the paper, it may be necessary to form a long longitudinal slot in film 13 over each of source and drain. If, on the other hand, the dimension, into the paper of FIG. 2, is relatively small, only a relatively discrete aperture need be cut. Irrespective of its length, the slot should not approach too closely the edge of aperture 14 to insure the integrity of passivating film 12 at the intersection with PN junctions 17 and 18.

Such an aperture is readily cut by covering the entire wafer with a photoresist layer and covering only the portions thereof corresponding to the desired configuration of the apertures to be cut to source and drain regions, respectively. Then after irradiation and development of the photoresist, the photoresist remains in all but the portions at which it is desired to cut source and drain apertures. The source and drain apertures 19 and 20 are then cut by immersing the wafer in a suitable etchant for the insulator material of film 13. When film 13 is silicon dioxide, the source and drain apertures may be formed by immersing in a Buffered HF solution. This material etches silicon dioxide at a rate of approximately 1000 AU per minute. It is, therefore, necessary to submerge a wafer having a 5000 AU thick film 13 of silicon dioxide and a 1000 AU thick film 12 of silicon dioxide for six minutes to cause the removal of the source and drain apertures down to the surface 11 of silicon wafer 10. The wafer may be immersed a slight time in excess of this, since the Buffered HF etchant has not noticeable effect upon silicon and it is necessary to remove all of the silicon dioxide in the source and drain apertures. After etching, the wafer is removed from the etching bath, washed, and evaporated with a suitable metal to fill source and drain apertures 19 and 20, respectively, and form source, drain, and gate electrodes. Conveniently, however, the wafer may at this point be annealed at 300° C. for two hours in a hydrogen atmosphere to eliminate fast interface states, as is well known.

To form source, drain, and gate electrodes, the wafer is placed in an evaporation chamber, and a film 21 of aluminum of approximately two-tenths to one micron thickness is formed upon the surface of the wafer which, during formation, causes apertures 14, 19, and 20 to be filled, forming a gate electrode 22 and source and drain electrodes 23 and 24 within source and drain apertures 19 and 20. This may be accomplished by causing the vacuum evaporation of aluminum in the chamber to continue for approximately 15 to 30 seconds. After evaporation of the aluminum, a photoresist layer is coated over the aluminum film and a suitable mask, covering all portions of the wafer, except regions at which it is desired to form contacts to source and drain electrodes and the gate is placed over the film. The photoresist is then irradiated, fixing the photoresist in the regions of the desired source, drain, and gate electrode contact regions.

After the photoresist film is developed, the wafer is immersed in a suitable etchant for aluminum as, for example, an orthophosphoric etch consisting essentially of 76 volume percent of orthophosphoric acid, 6 volume percent of glacial acetic acid, 3 volume percent of nitric acid, and 15 volume percent of water, for approximately two minutes to cause the removal of all of the aluminum film except at the enlarged source and drain electrode contact members 25 and 26 and the gate electrode contact 27, each of which is electrically isolated from the others, as is illustrated in FIG. 2*g* of the drawing. In FIG. 2*g* source and drain 16 are surface-adjacent, conductivity-modified, N-type regions defining source and drain PN junctions 17 and 18, respectively, with the P-type wafer 10, which junctions are passivated at the intersection with surface 11 of wafer 10 by passivation film 12, which is left intact throughout processing, except for etching therethrough to form source and drain apertures 23 and 24. Even this does not affect the passivation of the junctions, since the source and drain are formed remote from the intersection of the junctions 17 and 18 with surface 11.

Additionally, both the intersections of junctions 17 and 18 with surface 11 occur under gate electrode 22, so that the surface-adjacent channel 28 which is formed along surface 11 between source 15 and drain 16 is wholly covered, although electrically insulated from, the gate electrode. This self-registration is ideal and is particularly necessary in enhancement mode FET devices. This registration is readily obtained, in accord with the present invention, by the formation of the gate region 14, subsequently filled by gate electrode 22, at the same time that the extent of the source and drain regions 15 and 16 are defined by the etching of film 13, which defines the doped film source from which the activators to conductivity-modify source and drain regions 15 and 16, respectively, emanate.

In accord with the present invention, this self-registration is achieved by the relatively simple matter of etching a single, thick silicon dioxide film to form the gate region. After the formation of source electrode contact 25, gate contact 27, and drain contact 26, electrical connection may be made thereto by thermo-compression bonding, or other desirable means. Similarly, contact may be made to the base region of the transistor by alloying the wafer 10 to a suitable header with a suitable solder, appropriately doped with acceptor activator, so as to form nonrectifying contact with the header. Although, in practice, the formation of such devices is generally done by fabricating hundreds or thousands of such devices upon a single wafer and then separating them, this description, for simplicity is with respect to a single such device.

In accord with another embodiment of the present invention, field-effect transistor devices having automatic self-registry, as in the embodiment of FIGS. 1 and 2, and having, additionally, the added protection of the gate dielectric with an activator-impervious film of silicon nitride, are formed as illustrated in FIGS. 3 and 4 of the drawing, and described below.

In FIGS. 3 and 4, a device, as described above, is formed by starting with a silicon wafer 30, as described with respect to FIGS. 1 and 2, and forming thereupon a 1000 AU thick film of silicon dioxide by heating in an atmosphere of dry oxygen at approximately 1000° C. to 1200° C., for approximately three to one-half hour, respectively, depending on temperature and crystallographic orientation. As is described hereinbefore with respect to FIGS. 1 and 2, a thick film of doped silicon dioxide, doped either with a donor as, for example, phosphorus, if the original wafer is P-type, or with an acceptor as, for example, boron, if the original wafer is N-type, is deposited over film 32. As in the previous embodiment, the film 33 of doped silicon dioxide may be 5000 AU thick and entirely doped with phosphorus, for example by pyrolysis from argon gas saturated with ethyl orthosilicate and triethylphosphate for approximately five minutes to form the 5000 AU thick film. Alternatively, a first 1000 AU thick film of undoped silicon dioxide may be formed by pyrolysis from an argon-saturated flow of ethyl orthosilicate alone for one minute. Subsequent thereto, a 4000 AU thick film of phosphorus-doped silicon dioxide is formed by pyrolysis from argon saturated with ethyl orthosilicate and triethylphosphate as described above, for approximately four minutes.

As in the foregoing embodiment of the invention, the wafer is covered with a film of photoresist as, for example, Eastman Kodak KPR, and all except that existing at region 34, which is to be etched away to form the gate aperture, is irradiated and developed. After development of the KPR, the wafer is immersed in a Buffered HF solution and etched for approximately five minutes with the operator taking due care to observe when the color of the wafer in region 34 changes from the characteristic green or blue-green color of the doped dioxide to the deep cobalt blue of the undoped silicon dioxide. As in the previous example, if the thick film 33 is a composite of a thin film portion of undoped silicon dioxide and a thicker film portion of doped silicon dioxide, some penetration into the blue-appearing oxide may be permitted to gain assurance that all of the doped silicon dioxide is removed by the etching, without actually penetrating into the high-purity, thermally-grown oxide film 32 and causing any subsequent harm thereto.

After etching to form aperture 34 in film 33, leaving remaining separate portions 35 and 36 thereof, the wafer is washed in trichloroethylene, for example, to remove the photoresist and is returned to the film deposition chamber.

In accord with this embodiment of the invention, a thin film of approximately 200 to 300 AU thickness of silicon nitride is next formed over the entire wafer. This may conveniently be accomplished by heating the wafer to a temperature of approximately 1000° C. while passing a mixture of silane and ammonia over the heated wafer for a period of approximately two to three minutes. The pyrolytically-deposited silicon nitride film 37 is of approximately 200 to 300 AU thickness and is highly dense and uniform in characteristics. Alternatively, such a film may be formed upon a cold wafer surface by triode glow discharge sputtering or by vacuum evaporation.

After formation of the silicon nitride film 37, the wafer is heated to approximately 1100° C. for a period, the length of which depends upon whether the film 33 is entirely of phosphorus-doped silicon dioxide, or whether the film comprises a first undoped thin film portion and a second thicker film portion of doped silicon dioxide. The desired diffusion time, for example, however, may vary from one to four hours, as before, and results in the formation of source and drain regions 38 and 39 having phosphorus diffused therein from regions 35 and 36 of film 33, respectively, to a depth of approximately 2.5 microns. As in the previous embodiment, the PN junctions 40 and 41 formed between source and drain regions 38 and 39, respectively, on one hand, and the main body of the wafer 30 terminate at the intersections with surface 31 under the gate aperture 34.

It is next necessary to form source and drain apertures within the regions 35 and 36 overlying source and drain regions 38 and 39, respectively. Due to the presence of the silicon nitride film 37, this is somewhat more complicated than in the previous embodiment.

In order to form source and drain apertures, the process may, for example proceed substantially as follows. A film 42 of molybdenum of approximately 1000 AU in thickness is formed upon the entire wafer over the silicon nitride layer 37. This molybdenum film may be formed by sputtering in a glow discharge from a molybdenum target in a triode discharge configuration at a pressure of approximately 0.007 torr of argon. The process may continue for approximately five minutes to form a 1000 AU thick film of molybdenum. The molybdenum-covered wafer is next covered with a photoresist and the photoresist is developed in a pattern covering all but the desired holes to be formed through regions 35 and 36 to source and drain, respectively. After forming and developing the photoresist pattern, the wafer is first immersed in a potassium ferricyanide etch bath comprising, for example, 92 grams $K_2Fe(CN)_6$, 20 grams KOH, 300 grams $H_2O$, for approximately ten seconds to cause the molybdenum film to be removed in the vicinity of the source and drain apertures. The wafer is next washed in distilled water and immersed in a concentrated HF bath for approximately two to three minutes to cause the removal of the silicon nitride film in these regions. The wafer is next washed in distilled water and immersed in a Buffered HF etch bath for approximately six minutes to cause the regions 35 and 36 of film 33 at the source and drain apertures to be etched down through passivating film 32 to the surface 31 of the silicon wafer to form source and drain apertures 43 and 44, respectively. The condition of the wafer at this stage is illustrated in FIG. 4*h*. Next, it is desirable to eliminate fast interface states by a hydrogen anneal at approximately 600° C. for about two hours.

After removal of the photoresist mask over the wafer by washing in trichloroethylene, for example, a film of aluminum is applied to the wafer, as in the previous example, by vacuum evaporation for approximately five minutes to fill source and drain apertures 43 and 44 and to cover the entire surface of the film, including the gate aperture 34 with a film of approximately 0.5 micron thick of aluminum.

A photoresist layer is applied over the aluminum film, and the photoresist is exposed and developed to cause the photoresist to remain only over those portions constituting source and drain electrodes and the gate electrode and enlarged portions thereof used as contact members. The wafer is then immersed in an orthophosphoric acid etch for approximately five minutes to cause removal of the excess aluminum, leaving source contact member 48, gate contact member 50, and drain contact member 49, all of which are electrically isolated one from the other and which are in electrical contact with source, gate, and drain electrodes, respectively. Electrical connection is made to source, gate, and drain contacts at 51, 52, and 53, respectively, as for example, by thermo-compression bonding. As in the previous example the base of the transistor may be connected by suitably alloying the opposite major surface 54 of wafer 30 to a suitable header by forming a nonrectifying contact by using an alloy as, for example, gold doped with indium, to form a nonrectifying contact. Alternatively, instead of forming an etch mask of molybdenum over the silicon nitride film, silicon dioxide may be utilized. This may be readily accomplished by pyrolytic deposition of a 1000 AU film, for example, of silicon dioxide, as is set forth hereinbefore. This eliminates the necessity of removing the etch mask, as is required when molybdenum is used, since the silicon dioxide may be left in place if desired.

To accomplish this, after the silicon nitride film has been formed, a 1000 AU film of $SiO_2$ is formed by pyrolysis of ethyl orthosilicate saturated argon upon the wafer at 800° C. for one minute. Next, the wafer is covered with KPR photoresist, masked, exposed, and developed as before. The wafer is then etched successively in Buffered HF for one minute to remove the exposed $SiO_2$, then in orthophosphoric acid etch for four minutes to remove the $Si_3N_4$ film. The remainder of the process proceeds as before except that the $SiO_2$ etch mask is also removed by the final Buffered HF etch step and the Al is deposited on the nitride film.

The finished device in accord with this embodiment of the invention is illustrated schematically in vertical cross section of FIG. 4*k*. In FIG. 4*k* the wafer 30 has induced therein source and drain regions 38 and 39, respectively, forming source and drain PN junctions 40 and 41, respectively. These junctions intersect the surface 31 of wafer 30 beneath passivating layer 32 at the portion thereof which is covered by the gate electrode 50. The gate electrode 50 is further separated from the wafer 30 by insulator 55 which is a portion of the originally-deposited silicon nitride layer 37. This additional isolation is helpful, particularly during the diffusion stage wherein regions 38 and 39 are formed, to prevent the diffusion of activator impurities form the doped oxide into the high-purity gate oxide which covers the channel region. A surface-adjacent channel 56 exists between source and drain regions 38 and 39 and is electrically modulated by a potential applied to gate electrode 50. Contact is made to gate electrode 50, to source and drain electrodes 46 and 47, respectively, by means of enlarged contact members, in the case of source and drain, represented by contact members 48 and 49, respectively, which are enlarged in order to facilitate the making of electrical contact thereto, the source and drain electrode members themselves being of very small transverse dimension.

The foregoing description is made with reference to the formation of N-channel field-effect transistor devices utilizing P-type conductivity wafers into which a concentration of phosphorus has been diffused from a phosphorus-doped glass, formed by pyrolysis from an argon gas flow saturated with triethyl phosphate and ethyl orthosilicate. Similarly, P-channel devices are formed in essentially the same manner, except that the starting wafer is a wafer of N-type conductivity characteristic having a donor concentration therein of approximately $10^{15}$ atoms of phosphorus per cc. thereof. P-type source and drain regions are formed therein by the controlled diffusion of boron atoms. Boron atoms are made available by coating the wafer with a boron-doped silicon dioxide film, as in the previous examples wherein phosphorus-doped silicon dioxide was used. To form such a boron-doped film, pyrolysis from a flow of argon gas saturated with ethyl orthosilicate and triethyl borate is utilized.

While the invention has been set forth herein with respect to general conditions, the following specific examples are given to enable those skilled in the art to duplicate the formation of specific devices in accord with the present invention. These examples are set forth as for purposes of example only, and are not to be construed in a limiting sense.

EXAMPLE 1

A linear field-effect transistor having an N channel, substantially as illustrated in FIG. 2*g* having a substantially square configuration of approximately 0.010 inch, having source and drain regions diffused approximately 2.5 microns into the surface thereof and having a gate electrode of approximately 6 microns wide which is undercut by approximately 2 microns on each edge thereof leaving a channel width of approximately 2 microns is formed substantially as follows. A high-purity silicon wafer having P-type conductivity characteristics, caused by the inclusion thereof of a concentration of approximately $10^{15}$ atoms per cc. thereof of boron, is cut to cause a major surface thereof to have a (1,0,0) crystallographic orientation and is lapped and polished smooth. The wafer is placed in a film deposition chamber and heated to approximately 1000° C. in an atmosphere of dry oxygen for approximately three hours to cause the formation thereon of a 1000 AU thick thermally-grown silicon dioxide film. The wafer is placed in the chamber at a temperature of 800° C., and a flow of argon gas having been bubbled through ethyl orthosilicate at a flow rate of 7 cubic feet per hour is passed over the heated wafer for one minute. After one minute an additional flow of argon gas of .7 cubic foot per minute which has been passed thorugh triethyl phosphate is mixed with the original flow and the composite flow is passed over the wafer, still heated ot a temperature of 800° C., for four minutes, resulting in the deposition of an additional 4000 AU thick film of phosphorus doped silicon dioxide. The wafer is removed and coated with a film of KPR Photoresist which is masked, irradiated, and developed leaving a pattern covering all but a central, longitudinal strip of six microns in width. The wafer is immersed in a Buffered HF etchant and is maintained therein for approximately five minutes under continuous surveillance. The unexposed portions of the silicon dioxide are observed and are initially seen to be pale blue in color. After approximately five minutes of etching, the color of the exposed silicon dioxide film turns deep blue. Etching is continued for 20 seconds more, after which the film is removed from the etchant. The wafer is next washed in trichloroethylene to remove the KPR film.

The wafer is washed in distilled water, dried, and returned to a diffusion oven. The wafer is heated for approximately four hours at a temperature of 1100° C. to cause the diffusion of the activator atoms into source and drain regions to occur.

After diffusion, the wafer is coated with a layer of KPR photoresist and irradiated and developed leaving all of the wafer covered except a pair of longitudinal strips running the length of the wafer parallel with the original trough made by etching of the doped silicon dioxide film, each exposed region being centered in the remaining silicon dioxide film portion and having a width of approximately 0.003 inch. The wafer is next immersed in a Buffered HF etchant and allowed to remain therein for six minutes. The wafer is then removed, washed in trichloroethylene to remove the KPR, washed in distilled water, and dried. The wafer is next annealed in hydrogen gas at 300° C. for two hours.

The wafer is next placed in an aluminum vacuum-evaporation furnace and a film of approximately 0.5 micron of aluminum is evaporated thereon. The wafer is removed from the evaporation chamber and a film of KPR photoresist coated thereon. The photoresist is masked, irradiated, and developed, so as to expose all but those portions of the film covering the original trough in the first-etched doped silicon dioxide film and an enlarged contact-making portion adjacent thereto, and the two recently-etched 0.003 inch thick troughs each having an enlarged contact-making portion making contact therewith. The wafer is next immersed in orthophosphoric acid etch for 30 seconds to cause the exposed portions of the aluminum film to be removed. The wafer is then washed in distilled water, then washed in trichloroethylene to remove the remaining photoresist. The wafer is cut to size, polished and mounted, by means of a donor-doped gold alloy solder, to a copper header. Contacts to source, gate, and drain electrode enlarged contact members are made by thermo-compression bonding.

EXAMPLE 2

A P-channel device similar to that of Example 1 is made identically as in Example 1, except that the starting material is an N-type silicon wafer having a concentration of phosphorus of approximately $10^{15}$ atoms per cc. thereof. In forming the activator doped silicon dioxide film, an argon flow through triethyl borate rather than through triethyl phosphate is used. This causes the formation of a boron-doped silicon dioxide film. The other steps of the process are as in Example 1.

EXAMPLE 3

An N-channel field-effect transistor having oxide and nitride passivation is formed having the same geometrical configurations as the device of FIG. 1. The starting wafer is as in Example 1. A thermally-grown 1000 AU thick film of silicon dioxide and a composite undoped and doped pyrolytically-formed 5000 AU thick film of silicon dioxide is formed upon the wafer and is patterned as in Example 1. After the formation and patterning of the doped silicon dioxide film and diffusion, a thin film of approximately 300 AU of silicon nitride is formed thereover by pyrolysis from an atmosphere of silane and ammonia at a temperature of 1000° C. for approximately three minutes. After formation of the silicon nitride film the wafer is placed in a triode sputtering apparatus, utilizing a molybdenum target and sputtering is carried out in an atmosphere of 0.015 torr of argon for five minutes to cause the formation of a 1000 AU thick film of molybdenum over the nitride film.

The wafer is next coated with a KPR photoresist layer which is masked, irradiated, and developed leaving all portions of the film coated except longitudinal troughs of approximately 0.003 inch width, centrally located over the remaining portions of the originally-formed and patterned silicon dioxide film. The wafer is washed in distilled water, dried and immersed in ferricyanide etch for 10 seconds, removed, washed in distilled water, and dried. The wafer is next immersed in concentrated HF etchant for approximately two minutes and removed. The wafer is next immersed in Buffered HF solution for six minutes, removed, washed in distilled water, and dried. The wafer is next washed in trichloroethylene to remove the photoresist pattern and immersed in ferricyanide etch for 10 seconds to remove the remaining molybdenum film, leaving the exposed nitride film and the source and drain holes etched to the silicon wafer. The wafer is next annealed in hydrogen for two hours at 600° C.

The wafer is next removed, washed in distilled water, dried, and placed in an aluminum-evaporation furnace wherein a film of approximately 0.5 micron thick of aluminum is evaporated thereover, filling the etched apertures therein.

After vacuum evaporation of the aluminum film, the wafer is coated with a KPR photoresist layer and is masked, irradiated, and developed so as to leave all portions of the wafer exposed except the central trough, which is the gate electrode, and the two lateral troughs, which are the source and drain electrodes, together with enlarged portions thereof overlying a part of the silicon nitride film, but not sufficiently large enough to contact the gate electrode or gate contact member. The wafer is next immersed in orthophosphoric acid etch for five minutes to remove undesired portions of the aluminum film. After five minutes of etching in orthophosphoric acid, the wafer is removed, washed in trichloroethylene to remove the remaining photoresist, washed in distilled water, and dried. The wafer is alloyed to a copper header with an acceptor-doped gold solder. Contacts are made to source gate, and drain electrode members by thermo-compression bonding.

EXAMPLE 4

A P-channel field-effect transistor, as is described in Example 3, is formed by identical steps to those of Example 3, except that the starting material is a wafer of N-type silicon doped with phosphorus to a concentration of approximately $10^{15}$ atoms per cc. of phosphorus. Additionally, instead of utilizing a flow of 0.7 cubic foot per minute of argon having been bubbled through triethylphosphate, the same flow of argon is bubbled through triethyl borate to form a boron-doped thick film of silicon dioxide as in Example 3. Otherwise the process steps of Example 3 are followed to form a P-channel field-effect device having oxide and nitride gate insulation.

EXAMPLE 5

The process steps of Example 3 are followed up to and including the deposition of the $Si_3N_4$ film. The wafer is next returned to the deposition chamber and a flow of argon saturated with ethyl orthosilicate is passed thereover at a rate of 7 cubic feet per minute while the wafer is maintained at 800° C. for one minute to cause a 1000 AU film of $SiO_2$ to be pyrolytically deposited thereover. The wafer is next coated with KPR Photoresist, exposed, and developed to expose source and drain apertures in the mask thereof parallel with the gate aperture and 0.003 inch wide. The wafer is immersed in Buffered HF for one minute to remove the $SiO_2$ at source and drain apertures, then rinsed and immersed in hypophosphoric acid etchant for four minutes to remove the $Si_3N_4$ thereat. The wafer is then washed and immersed in Buffered HF for six minutes causing the source and drain apertures to extend to source and drain regions. The remaining steps of Example 3 are carried out to complete the formation of the device.

While the invention has been set forth hereinbefore with respect to certain embodiments and specific examples thereof, many modifications and changes will readily occur to those skilled in the art. Accordingly, I intend, by the appended claims, to cover all such modifications and changes as fall within the true spirit and scope of the invention.

What I claim as new and desire to secure by Letters Patent of the United States is:

1. The method of forming self-registered, field-effect transistors which method comprises:

(a) preparing a crystalline wafer of one-conductivity-type semiconductor having a substantially planar major surface, (b) forming a thin, high-purity insulating film on said major surface of said semiconductor wafer, (c) depositing a thick insulating film doped with an an activator for inducing opposite-conductivity-type characteristics in said semiconductor wafer, (d) patterning said doped insulating film by selectively removing a portion of said thick doped insulating film, ($d_1$) the portion of said doped insulating film which is removed constituting a gate aperture which separates the remaining portions of said doped insulating film into two separate regions, (e) heating said wafer to cause said activator to diffuse through said thin high purity insulating film into two separate major-surface-adjacent regions of said wafer from said two separate regions of said patterned doped insulating film to form source and drain regions, (f) forming source and drain apertures in said two separate portions of said doped insulating film to expose said source and drain regions of said semiconductor wafer, (g) forming a gate electrode in said gate aperture and source and drain electrodes in said source and drain apertures, (h) making electrical contact to said source, drain, and gate electrodes.

2. The method of claim 1 wherein said thick deposited insulator includes a first thin deposited undoped film portion and a second thick deposited doped film portion and said thick film is removed at said gate aperture through said second film part and into said first film part, but not therethrough.

3. The method of claim 1 wherein said semiconductor is silicon, said first-formed thin insulating film is silicon dioxide and said second formed thick insulating film is silicon dioxide.

4. The method of clam 3 wherein said first formed silicon dioxide film is thermally grown in an oxygen atmosphere.

5. The method of claim 1 wherein a film of silicon nitride is deposited over said patterned thick doped insulating film prior to diffusion of activator from said thick doped insulating film to form source and drain region in order to prevent diffusion of activator impurities from said doped insulating film into said thin high purity insulating film in the region of said gate aperture.

6. The method of claim 5 in which an etch mask is formed over said silicon nitride film to prevent etching of source and drain regions therein without damaging the remainder of said insulating films.

7. The method of claim 5 wherein said etch mask is molybdenum.

8. The method of claim 5 wherein the each mask is silicon dioxide.

References Cited

UNITED STATES PATENTS

| | | | |
|---|---|---|---|
| 3,165,430 | 1/1965 | Hugle | 29—571 |
| 3,200,019 | 8/1965 | Scott et al. | 29—578 |
| 3,387,358 | 6/1968 | Heiman | 29—571 |
| 3,426,422 | 2/1969 | Deal | 29—571 |
| 3,438,873 | 4/1969 | Schmidt | 29—578 |
| 3,447,238 | 6/1969 | Heynes et al. | 29—590 |

JOHN F. CAMPBELL, Primary Examiner

R. B. LAZARUS, Assistant Examiner

U.S. Cl. X.R.

29—578